United States Patent
Jain et al.

(10) Patent No.: US 9,129,661 B2
(45) Date of Patent: Sep. 8, 2015

(54) SINGLE PORT MEMORY THAT EMULATES DUAL PORT MEMORY

(71) Applicants: Aarul Jain, New Delhi (IN); Rakesh Pandey, Noida (IN); Rohit S. Patel, Siddhpur (IN)

(72) Inventors: Aarul Jain, New Delhi (IN); Rakesh Pandey, Noida (IN); Rohit S. Patel, Siddhpur (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 177 days.

(21) Appl. No.: 14/016,125

(22) Filed: Sep. 1, 2013

(65) Prior Publication Data
US 2015/0067275 A1    Mar. 5, 2015

(51) Int. Cl.
*G06F 12/00*    (2006.01)
*G11C 7/10*    (2006.01)

(52) U.S. Cl.
CPC ..................................... *G11C 7/1075* (2013.01)

(58) Field of Classification Search
CPC ......... G11C 7/10; G11C 7/1075; G06F 12/00
USPC .................................................. 711/154, 149
See application file for complete search history.

(56) References Cited

U.S. PATENT DOCUMENTS

| | | |
|---|---|---|
| 5,371,877 A | 12/1994 | Drako |
| 5,781,480 A | 7/1998 | Nogle |
| 6,189,073 B1 | 2/2001 | Pawlowski |
| 7,349,285 B2 | 3/2008 | Balasubramanian |
| 7,643,330 B1 | 1/2010 | Lin |
| 2011/0310691 A1 | 12/2011 | Zhou |

*Primary Examiner* — Matthew Bradley
(74) *Attorney, Agent, or Firm* — Charles Bergere

(57) ABSTRACT

A single-port memory that operates in single-cycle dual-port mode has a logical capacity of N=k·m memory words and (k+1) single-port RAM having an overall physical capacity of (k+1)·m memory words. A status register holds words identifying which RAM bank has the last data at the $i^{th}$ address in the RAM banks and defining k status words for valid data among the (k+1) RAM banks. Write data is written to the write address of a valid RAM bank for a write operation in the absence of RAM bank read address contention. Write data is written to the write address of a different RAM bank that has no valid data for a write operation if there is contention with the RAM bank read address RADDR of a read operation. The status register is updated to identify the RAM bank of the write operation.

14 Claims, 4 Drawing Sheets

| Cycle Number | Operation | FF1 | FF(m+1) | Bank0 | Bank1 | Bank2 |
|---|---|---|---|---|---|---|
| 0 | Reset | 00 | 01 | - | - | - |
| 1 | R(Addr1) | 00 | 01 | Read | - | - |
| 2 | R(Addr(m+1)) | 00 | 01 | - | Read | - |
| 3 | R(Addr1), W(Addr1) | 00→10 | 01 | Read | - | Write |
| 4 | R(Addr(m+1)),W(Addr(m+1)) | 10 | 01→00 | Write | Read | - |
| 5 | R(Addr1) | 10 | 00 | - | - | Read |
| 6 | R(Addr(m+1)) | 10 | 00 | Read | - | - |
| 7 | R(Addr(m+1)),W(Addr1) | 10 | 00 | Read | - | Write |
| 8 | R(Addr1),W(Addr(m+1)) | 10 | 00 | Write | - | Read |
| 9 | R(Addr1) | 10 | 00 | - | - | Read |
| 10 | R(Addr(m+1)) | 10 | 00 | Read | - | - |

US 9,129,661 B2

SINGLE PORT MEMORY THAT EMULATES DUAL PORT MEMORY

BACKGROUND OF THE INVENTION

The present invention is directed to semiconductor memories and, more particularly, to a single port memory that emulates a dual port memory.

Dual-port memory is widely used since single-cycle dual-port mode of operation allows read and write operations to be performed simultaneously, or nearly simultaneously, whereas single-port random-access memory (RAM) only allows one access at a time. This confers some performance advantages on dual-port memory as compared to single-port memory. However, dual-port memory may be excluded from some designs because it is less reliable at low voltages and more sensitive to low voltage failures. For example, because they are less reliable, dual-port memories are excluded from most circuits used in automotive and medical applications. On the other hand, the circuits used for automotive applications are otherwise much the same as those used in applications with less stringent safety and reliability requirements. Therefore, there is a need to operate single-port memories as if they were dual-port memories so that the other common circuitry may be shared.

It is possible for a single-port memory to operate in a dual-port mode. This can be achieved by accessing the single-port memory in alternate clock cycles, or at alternate edges of the clock cycles. However, this approach effectively limits the dual-port mode of operation to half the maximum clock frequency of a dual port memory.

A single-port memory that operates in single-cycle dual-port mode can avoid such a halving of maximum clock frequency by providing two single-port memory banks, duplicating the memory capacity of the equivalent dual-port memory, and with a register to discriminate the read/write addresses. However, this approach is expensive in terms of circuit area.

Accordingly, there is a need for a single-port memory that can operate in a dual-port mode but that does not compromise system performance.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

In one embodiment, the present invention provides a single-port memory capable of operating in single-cycle dual-port mode and having a logical capacity of $N=k \cdot m$ memory words. The memory includes a number $(k+1)$ of single-port random access memory (RAM) banks having an overall physical capacity of $(k+1) \cdot m$ memory words. The RAM banks are used to store write data. A status register holds at least $N=k \cdot m$ status words, of which an $i^{th}$ status word identifies which RAM bank has the last data to have been written at the $i^{th}$ address, where $i \in [0, k \cdot m]$, and defines k status words for valid data among the $(k+1)$ RAM banks. There also are a write data input and a read data output. Control logic is provided that receives read and write enable signals, read and write addresses, and write data from the write data input, supplies read data from a corresponding read address of a valid RAM bank to the read data output for a read operation, writes write data from the write data input to a write address of a valid RAM bank for a write operation in the absence of contention with the RAM bank of a read operation, writes the write data from the write data input to the write address of a RAM bank that has no valid data for a write operation at that write address in the case of contention with the RAM bank of a read operation, wherein the read and write operations are performed in a single cycle, and updates the status register to identify the RAM bank of the write operation.

In another embodiment, the present invention provides a method of operating a single-port memory in a single-cycle dual-port mode. The memory has a logical capacity of $N=k \cdot m$ words and includes a number $(k+1)$ of single-port random access memory (RAM) banks having an overall physical capacity of $(k+1) \cdot m$ memory words, and a status register for holding at least $N=k \cdot m$ status words. The method includes setting data in the status register with an $i^{th}$ status word identifying which RAM bank has the last data written at the $i^{th}$ address, where $i \in [0, k \cdot m]$, and defining k status words for valid data among the $(k+1)$ RAM banks; receiving by control logic of the memory, read and write enable signals, read and write addresses, and write data from a write data input; supplying read data from the corresponding read address of the valid RAM bank to a read data output for a read operation; writing write data from a write data input to the write address of a valid RAM bank for a write operation in the absence of contention with the RAM bank of a read operation; writing write data from the write data input to the write address of a RAM bank that has no valid data for a write operation at that write address in the case of contention with the RAM bank of a read operation, wherein the read and write operations are performed in a single cycle; and updating the status register to identify the RAM bank of the write operation.

Figure 1:
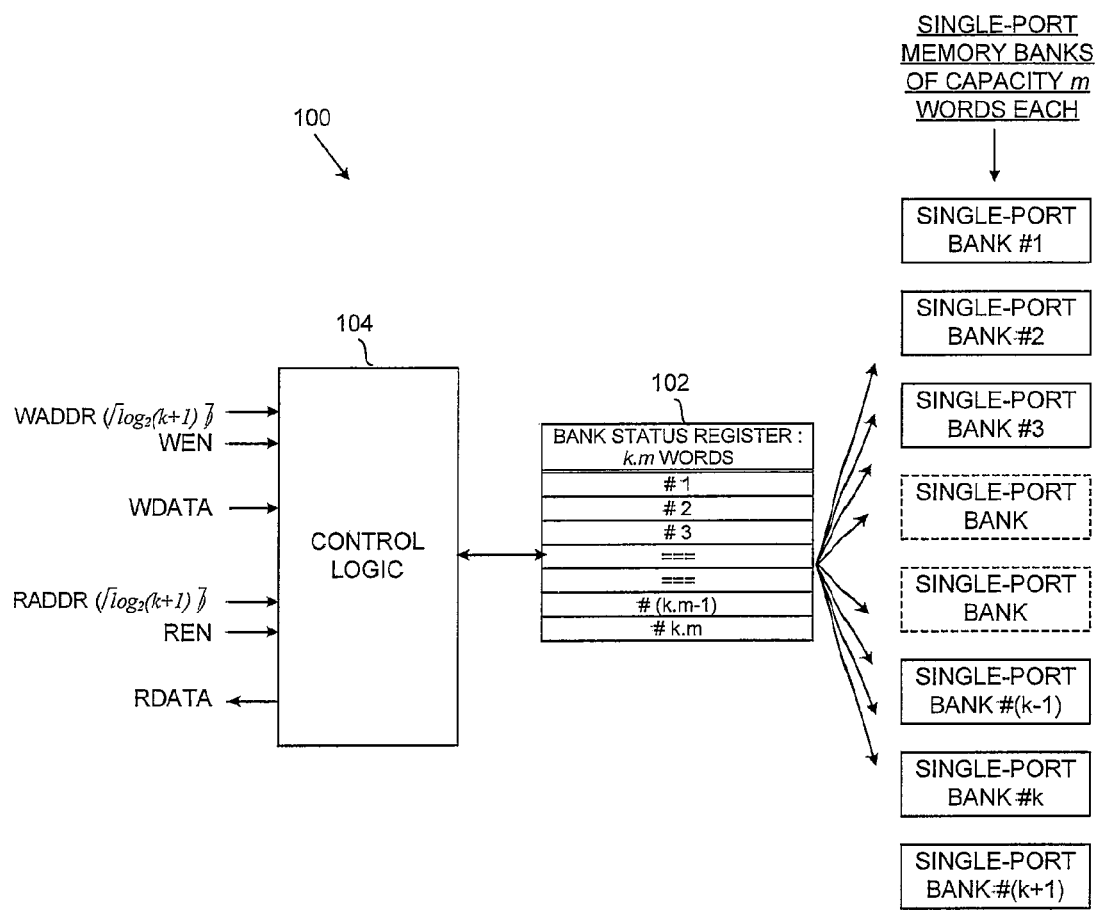
FIG. 1 is a schematic block diagram of memory having single-port memory banks operating in single-cycle dual-port mode in accordance with an embodiment of the present invention.

Referring now to FIG. 1, a schematic block diagram of a memory 100 capable of operating in single-cycle dual-port mode in accordance with an embodiment of the invention is shown. The memory 100 has a logical capacity of $N=k \cdot m$ memory words. The memory 100 has a number $(k+1)$ of single-port random access memory (RAM) banks BANK #1 to BANK #(k+1) having an overall physical capacity of $(k+1) \cdot m$ memory words. A status register 102 holds at least $N=k \cdot m$ status words, of which the $i^{th}$ status word identifies which RAM bank has the last data to have been written at the $i^{th}$ address (where $i \in [0, k \cdot m]$) and defines k status words for valid data among the $(k+1)$ RAM banks. Control logic 104 receives read and write enable signals REN and WEN, read and write addresses RADDR and WADDR, and write data WDATA from a write data input. The control logic 104 supplies read data from the corresponding read address of the valid RAM bank BANK #1 to BANK #(k+1) to a read data output for a read operation. The control logic 104 writes the write data WDATA from the write data input to the write address WADDR of a valid RAM bank for a write operation in the absence of contention with the RAM bank of a read operation. The control logic 104 writes the write data WDATA from the write data input to the write address WADDR of a RAM bank that has no valid data for a write operation at that write address in the case of contention with the RAM bank of a read operation. The read and write operations are performed in a single cycle. The control logic 104 updates the status register to identify the RAM bank of the write operation.

Figure 5:
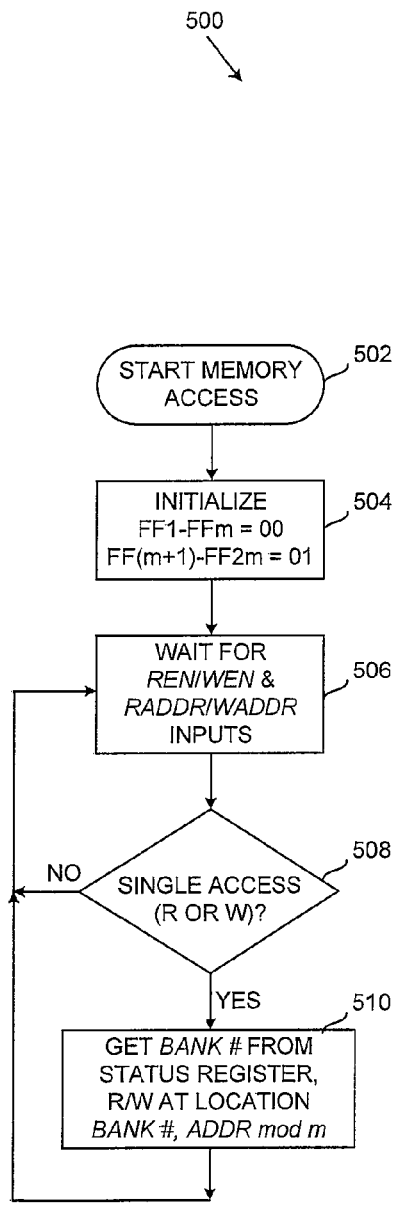
FIG. 5 is a flow chart of an example of operation of the memory of FIG. 1 in the case of single read access or single write access.
Figure 6:
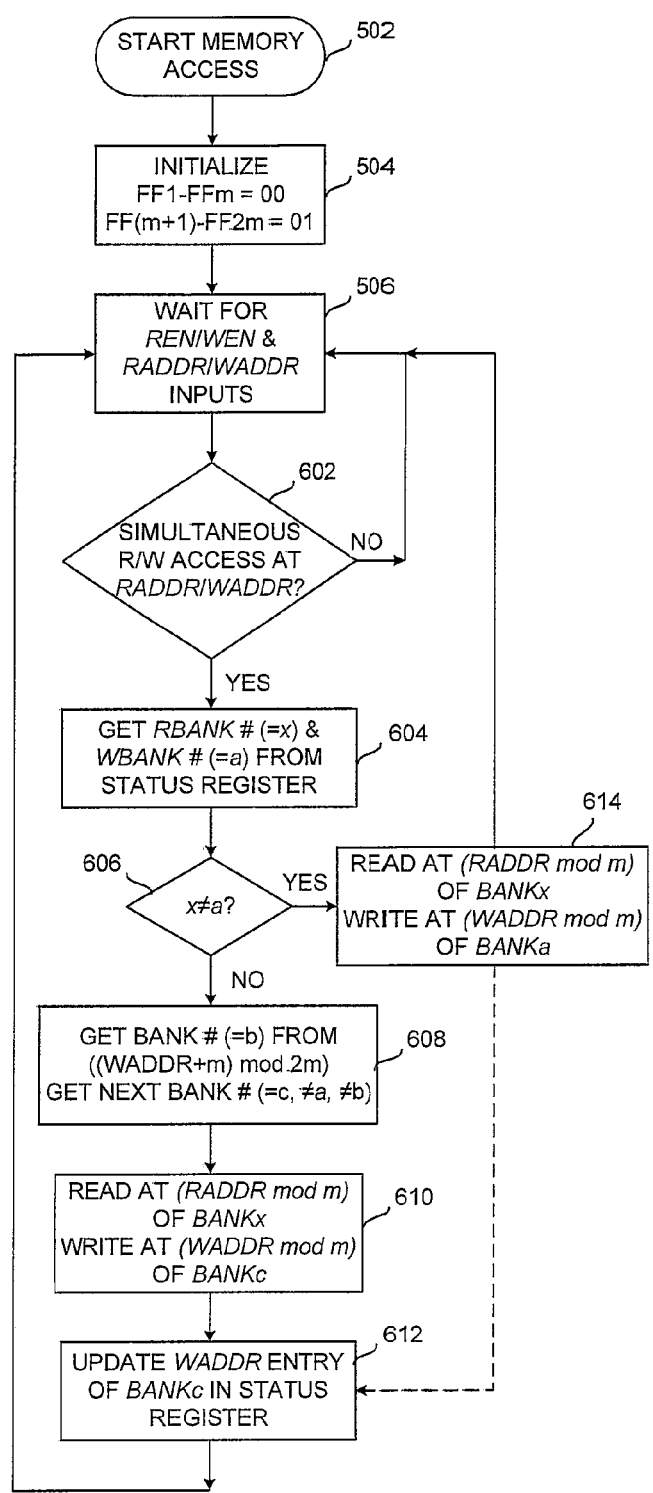
FIG. 6 is a flow chart of an example of operation of the memory of FIG. 1 in the case of simultaneous read and write accesses.

FIGS. 5 and 6 illustrate a method 500, in accordance with an embodiment of the invention, of the memory 100 operating in single-cycle dual-port mode having a logical capacity of $N=k \cdot m$ memory words. The memory 100 has a number (k+1) of single-port random access memory (RAM) banks BANK #1 to BANK #(k+1) having an overall physical capacity of (k+1)·m memory words. A status register 102 holds at least $N=k \cdot m$ status words. The method 500 includes setting the data in the status register with the $i^{th}$ status word identifying which RAM bank has the last data to have been written at the $i^{th}$ address (where $i \in [0, k \cdot m]$) and defining k status words for valid data among the (k+1) RAM banks. Read and write enable signals REN and WEN, read and write addresses RADDR and WADDR, and write data WDATA from a write data input are received. Read data from the corresponding read address of the valid RAM bank BANK #1 to BANK #(k+1) is supplied to a read data output for a read operation. Write data WDATA from the write data input is written to the write address WADDR of a valid RAM bank for a write operation in the absence of contention with the RAM bank of a read operation. Write data WDATA from the write data input is written to the write address WADDR of a RAM bank that has no valid data for a write operation at that write address in the case of contention with the RAM bank of a read operation. The read and write operations are performed in a single cycle. The status register 102 is updated to identify the RAM bank of the write operation.

The (k+1) RAM banks BANK #1 to BANK #(k+1) may each have the same capacity of m words.

The k·m words of the status register 102 may be binary and each have at least $\lceil \log_2(k+1) \rceil$ bits, where $\lceil \log_2(k+1) \rceil$ represents the next integer larger than $\log_2(k+1)$.

The number (k+1) of single-port random access memory (RAM) banks BANK #1 to BANK #(k+1) of the memory 100 preferably is at least three. The read and write addresses may be random access addresses.

Figure 2:
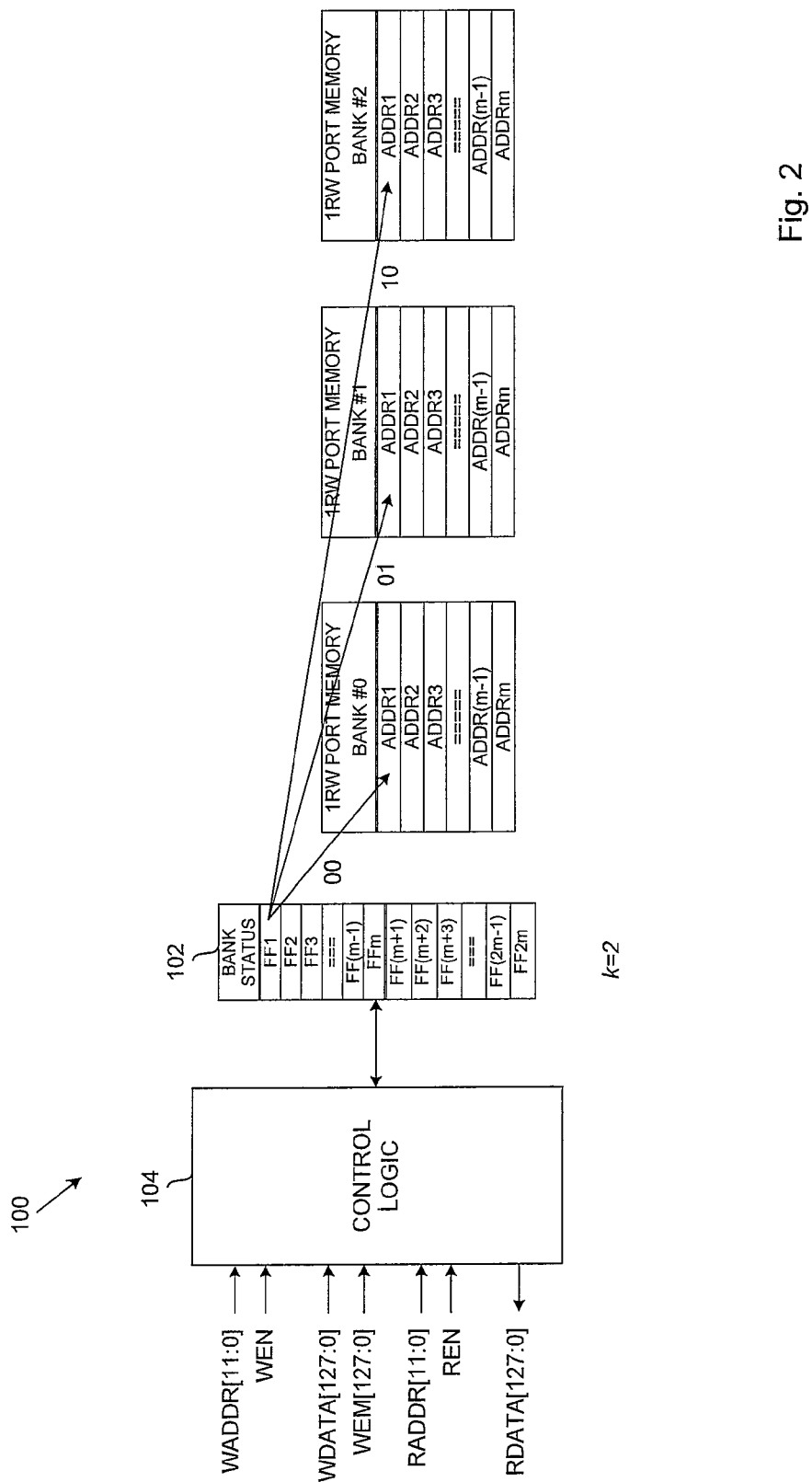
FIG. 2 is a schematic block diagram of the memory of FIG. 1 having three single-port memory banks.
Figures 3, 4:
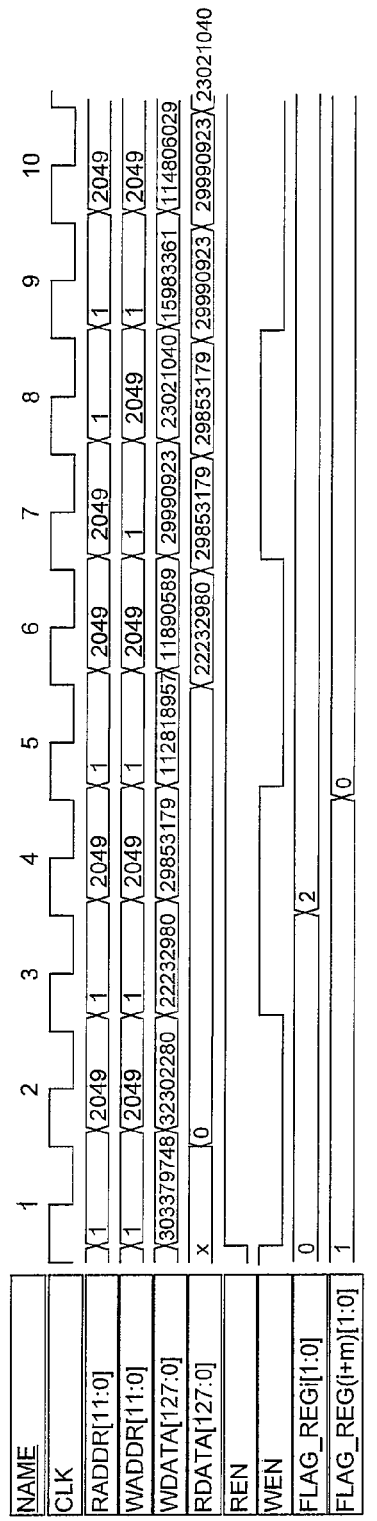
FIG. 3 is a timing diagram of signals appearing in an example of operation of the memory of FIG. 1.
FIG. 4 is a table of data entries and accesses in the operation illustrated in FIG. 3.

In one example of the memory 100, illustrated in FIGS. 2 to 4, the memory 100 has a number (k+1)=3 of single-port RAM banks BANK #1 to BANK #3 having an overall logical capacity of 2·m memory words and an overall physical capacity of 3·m memory words. The status register 102 holds at least $N=2 \cdot m$ of the status words and defines two status words for valid data at locations j (where $j \in [0,m]$) among the three RAM banks. The three RAM banks BANK #1 to BANK #3 may each have the same capacity of m words The 2·m words of the status register 102 may be binary and each have at least $\lceil \log_2 3 \rceil = 2$ bits. The memory 100 is illustrated in FIGS. 2 to 4 for an example where m=2048 in decimal notation, the logical capacity of the memory apparatus 100 is 4096 words of 128 bits and the physical capacity is 6144 words of 128 bits.

The memory 100 operates in single-cycle dual-port mode using single-port memory banks BANK #1 to BANK #(k+1) and is less sensitive to low voltage, such as 1.1V-10% for example, than equivalent dual-port memory. The memory 100 can operate at the full maximum clock frequency of the single-port memory banks with no additional clock phase signal needed.

The partitioning of the memory into single-port memory banks BANK #1 to BANK #(k+1) (where k≥2) in the memory 100 represents a saving of physical memory capacity. An equivalent memory of logical capacity $N=k \cdot m$ memory words that operated in single-cycle dual-port mode but that had only two single-port memory banks with a register to discriminate the read/write addresses would require 2·k·m words of physical memory capacity compared with (k+1)·m memory words for the memory 100. When k=2 the equivalent memory of logical capacity $N=2 \cdot m$ memory words that had only two duplicated single-port memory modules, each of which had the same individual memory capacity, would require overall 4m words of physical memory capacity, whereas the memory 100 of the same logical capacity $N=2 \cdot m$ memory words require only 3m words of physical memory capacity. The savings in physical memory size with this embodiment of the invention is even greater proportionately if the memory is partitioned in a greater number of banks (k+1>3).

In more detail, as shown in FIG. 1, the status register 102 has a number k·m words. The control logic 104 receives the read and write enable signals REN and WEN, read and write addresses RADDR and WADDR, and write data WDATA. FIG. 2 illustrates an example of the memory apparatus 100 having three static RAM (SRAM) banks BANK #1 to BANK #3 having an overall logical capacity of 2·m memory words and an overall physical capacity of 3·m memory words. The status register 102 holds $N=2 \cdot m$ status words. FIGS. 3 and 4 illustrate signals, data entries and accesses in examples of performance of the method 500. The timing of the memory 100 is synchronized by leading edges of a clock signal CLK. When a read operation is performed, the control logic 104 accesses the status word at the read address RADDR in the cells FF1 to FF2m (FF4096 in this example) of the status register 102, which designates in which of the RAM banks BANK #1 to BANK #3 the read operation is to be performed. When a write operation is to be performed, the control logic 104 accesses k status words at the write address WADDR in the cells FF1 to FF2m of the status register 102. The k (in this example two) entries FLAG_REGi and FLAG_REG(i+m) in the corresponding cells of the status register 102 indicate in which of the RAM banks BANK #1 to BANK #3 the write operation is to be performed. When simultaneous read and write operations are to be performed, the control logic 104 accesses the cells corresponding to the read and write operations simultaneously, in parallel, in the same clock cycle. The status word entry FLAG_REGi or FLAG_REG(i+m) for the read operation is accessed before any update of the status word due to a write operation, and is the value at the beginning of that clock cycle. The control unit 104 passes the signal RDATA for that address to the read output at the end of the corresponding clock cycle.

A memory access starts at 502. At 504, for the purposes of simulation, the status register 102 is assumed to be reset in cycle 0 by initializing the entries FLAG_REGi in the cells FF1 to FFm at 00 (in binary notation), designating memory bank #0, and the entries FLAG_REG(i+m) in the cells FF(m+1) to FF2m at 01, designating memory bank #1, although this reset is not necessarily performed in normal operation. At 506, the control logic 104 waits until read and write enable signals REN and WEN, and read and write addresses RADDR and WADDR are asserted at 508 or 602. Read data RDATA may be present but is not significant until fresh data is written, since the memory banks are SRAM.

At cycle 1 of the clock signal CLK, the read and write addresses RADDR and WADDR are illustrated as cell 1. The read enable signal REN is asserted and write data WDATA is present but is not entered, since the write enable signal WEN is de-asserted, so that at 508 a single access is detected. At 510, the signal FLAG_REGi in the status register 102 for the read address RADDR=1 designates BANK #0 and the control unit 104 passes the signal RDATA for that address to the read output starting at the end of the cycle 1, the signal RDATA being zero, since the read address RADDR=1 in the BANK #0 is empty.

At cycle 2 of the clock signal CLK, the read address RADDR is (m+1)=2049, the read enable signal REN is asserted and the write enable signal WEN remains de-asserted, so that at 508 a single access is again detected. At 510, the signal FLAG_REG(i+m) in the status register 102 for the read address RADDR=(m+1) designates BANK #1 and the control unit 104 passes the signal RDATA for that address to the read output starting at the end of the cycle 2, the signal RDATA again being zero, since the read address RADDR=2049 in the BANK #1 is also empty.

When the clock signal CLK is asserted in cycle 3, the write enable signal WEN is asserted, the read enable signal REN remaining asserted. During cycle 3 of the clock signal CLK, the read and write addresses RADDR and WADDR are both 1, so that a simultaneous access is detected at 602. At 604, the signal FLAG_REGi=x in the status register 102 for the read address RADDR=1 and the signal FLAG_REGi=a for the write address WRADDR=1 both designate the same bank BANK #0 (x=a), so that a read/write address contention is detected at 606. At 608, the signal FLAG_REG(i+m)=b in the status register 102 for the write address WADDR+m=1+m is fetched. The next bank number BANK #c=2 is chosen for writing access, which is different from the BANK #0 designated by the signal FLAG_REGi=x for the read address RADDR=1, and is also different from the bank BANK #1 designated by the signal FLAG_REG(i+m)=b for the last write operation at the write address WADDR+m=1+m. Accordingly the write operation does not over-write data which is still valid, but is written to an address which has no data or which contains invalid data. At 610, the control unit 104 passes the signal RDATA for the read address RADDR=1 of BANK #0 (the read address being absolute and having priority over the write operation) to the read output starting at the end of the cycle 3, the signal RDATA being zero, since the read address RADDR=1 in the BANK #0 is empty. The control unit 104 passes the signal WDATA for the write address WADDR=1 to write in BANK #c=2. At 612, the signal FLAG_REGi=2 entry in the status register 102 for the write address WADDR=1 is updated to designate BANK #2 (10 in binary notation).

At cycle 4 of the clock signal CLK, both the write enable signal WEN and the read enable signal REN are asserted and the read and write addresses RADDR and WADDR are both m+1=2049, so that a simultaneous access is detected at 602. At 604, the signal FLAG_REG(i+m)=x in the status register 102 for the read address RADDR=m+1 and the signal FLAG_REG(i+m)=a for the write address WRADDR=m+1 both designate the same bank BANK #1 (x=a), so that a read/write address contention is detected at 606. At 608, the signal FLAG_REGi=b in the status register 102 for the write address WADDR+m=1 is fetched. The next bank number BANK #c=0 is chosen for writing access, which is different from the BANK #1 designated by the signal FLAG_REG(i+m)=x for the read address RADDR=m+1, and is also different from the bank BANK #2 designated by the signal FLAG_REGi=b for the last write operation at the write address WADDR+m=1. At 610, the control unit 104 passes the signal RDATA for the read address RADDR=m+1 of BANK #1 (the read address being absolute and having priority over the write operation) to the read output starting at the end of the cycle 4, the signal RDATA being zero, since the read address RADDR=m+1 in the BANK #1 is empty. The control unit 104 passes the signal WDATA for the write address WADDR=m+1 to write in BANK #c=0. At 612, the signal FLAG_REG(i+m)=0 entry in the status register 102 for the write address WADDR=m+1 is updated to designate BANK #0 (00 in binary notation).

When the clock signal CLK is asserted in cycle 5, the write enable signal WEN is de-asserted, the read enable signal REN remaining asserted. During cycle 5 of the clock signal CLK, the read address RADDR is 1, the read enable signal REN is asserted and the write enable signal WEN is de-asserted, so that at 508 a single access is detected. At 510, the signal FLAG_REGi in the status register 102 for the read address RADDR=1 designates BANK #2 and the control unit 104 passes the signal RDATA for that address to the read output starting at the end of the cycle 5, the signal RDATA being the data WDATA written at that address in clock cycle 3.

At cycle 6 of the clock signal CLK, the read address RADDR is (m+1)=2049, the read enable signal REN remains asserted and the write enable signal WEN remains de-asserted, so that at 508 a single access is again detected. At 510, the signal FLAG_REG(i+m) in the status register 102 for the read address RADDR=(m+1) designates BANK #0 and the control unit 104 passes the signal RDATA for that address to the read output starting at the end of the cycle 6, the signal RDATA being the data WDATA written at that address in clock cycle 4.

When the clock signal CLK is asserted in cycle 7, the write enable signal WEN is asserted and the write address WADDR is 1. The read enable signal REN remains asserted and the read address RADDR is (m+1)=2049, so that a simultaneous access is detected at 602. At 604, the signal FLAG_REGi=x in the status register 102 for the read address RADDR=(m+1) designates BANK #0 and the signal FLAG_REGi=a for the write address WRADDR=1 designates a different bank BANK #2 (x≠a), so that no read/write address contention is detected at 606. At 614, the control unit 104 passes the signal RDATA for the read address RADDR=1 of BANK #0 to the read output starting at the end of the cycle 7, the signal RDATA again being the data WDATA written at that address in clock cycle 4. The control unit 104 passes the signal WDATA for the write address WADDR=1 to write in BANK #2. At 612, the signal FLAG_REGi=2 entry in the status register 102 for the write address WADDR=1 does not need to be updated and the process can return to step 506, at which the control logic 104 waits until read and write enable signals REN and WEN, and read and write addresses RADDR and WADDR are asserted at 508 or 602. However, as indicated in dashed lines in FIG. 6, the process may alternatively pass through update step 612.

At cycle 8 of the clock signal CLK, the write address WADDR is (m+1)=2049 and the read address RADDR is 1. The write enable signal WEN and the read enable signal REN remain asserted, so that a simultaneous access is detected at 602. At 604, the signal FLAG_REGi=x in the status register 102 for the read address RADDR=1 designates the BANK #2 and the signal FLAG_REG(i+m)=a for the write address WRADDR=m+1 designates a different bank BANK #0 (x≠a), so that no read/write address contention is detected at 606. At 614, the control unit 104 passes the signal RDATA for the read address RADDR=1 of BANK #2 to the read output starting at the end of the cycle 8, the signal RDATA being the data WDATA written at that address in clock cycle 7. The control unit 104 passes the signal WDATA for the write address WADDR=m+1 to write in BANK #0. At 612, the signal FLAG_REG(i+m)=2 entry in the status register 102 for the write address WADDR=m+1 does not need to be updated.

When the clock signal CLK is asserted in cycle 9, the write enable signal WEN is de-asserted, the read enable signal REN remaining asserted. At cycle 9 of the clock signal CLK, the read address RADDR is 1, the read enable signal REN is asserted and the write enable signal WEN is de-asserted, so that at 508 a single access is detected. At 510, the signal FLAG_REGi in the status register 102 for the read address RADDR=1 designates BANK #2 and the control unit 104 passes the signal RDATA for that address to the read output starting at the end of the cycle 9, the signal RDATA again being the data WDATA written at that address in clock cycle 7.

At cycle 10 of the clock signal CLK, the read address RADDR is (m+1)=2049, the read enable signal REN is asserted and the write enable signal WEN is de-asserted, so that at 508 a single access is again detected. At 510, the signal FLAG_REG(i+m) in the status register 102 for the read address RADDR=(m+1) designates BANK #0 and the control unit 104 passes the signal RDATA for that address to the read output starting at the end of the cycle 10, the signal RDATA being the data WDATA written at that address in clock cycle 8.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A single-port memory capable of operating in single-cycle dual-port mode and having a logical capacity of N=k·m memory words, the memory comprising:
   a number (k+1) of single-port random access memory (RAM) banks having an overall physical capacity of (k+1)·m memory words, wherein the RAM banks store write data;
   a status register for holding at least N=k·m status words, of which an $i^{th}$ status word identifies which RAM bank has the last data to have been written at an $i^{th}$ address, where i∈[0,k·m], wherein k status words are defined for indicating k RAM banks that have valid data among the (k+1) RAM banks;
   a write data input and a read data output; and
   control logic for receiving read and write enable signals, read and write addresses, and write data from the write data input, for supplying read data from a corresponding read address of a valid RAM bank to the read data output for a read operation, wherein the valid RAM bank for the read operation is determined based on the k status words, for writing the write data from the write data input to a write address of a valid RAM bank for a write operation in the absence of contention with the RAM bank of the read operation, for writing the write data from the write data input to the write address of a next RAM bank that has no valid data for the write operation at the write address in the case of contention with the RAM bank of the read operation, wherein the next RAM bank is determined based on the k status words, wherein the read and write operations are performed in a single cycle, and for updating the status register to identify the RAM bank of the write operation.

2. The memory apparatus of claim 1, wherein the (k+1) RAM banks each have the same capacity of m words.

3. The memory apparatus of claim 1, wherein the k·m words of the status register are binary and each word has at least $\lceil \log_2(k+1) \rceil$ bits, where $\lceil \log_2(k+1) \rceil$ represents the next integer larger than $\log_2(k+1)$.

4. The memory of claim 1, wherein the number (k+1) of RAM banks is at least three.

5. The memory of claim 1, wherein the read and write addresses are random access addresses.

6. A single-port memory that operates in dual-port mode and has a logical capacity of N=2·m words, the memory comprising:

three single-port random access memory (RAM) banks having an overall physical capacity of 3·m memory words;

a status register for holding at least N=2·m status words, of which an $i^{th}$ status word identifies which RAM bank has the last data written at an $i^{th}$ address, where $i \in [0, 2 \cdot m]$, wherein two status words are defined for indicating two RAM banks that have valid data among the three RAM banks;

a write data input and a read data output; and control logic for receiving read and write enable signals, read and write addresses, and write data from the write data input, for supplying read data from a corresponding read address of a valid RAM bank to the read data output for a read operation, wherein the valid RAM bank for the read operation is determined based on the two status words, for writing the write data from the write data input to a write address of a valid RAM bank for a write operation in the absence of contention with the RAM bank of the read operation, for writing the write data from the write data input to the write address of a next RAM bank that has no valid data for the write operation at the write address in the case of contention with the RAM bank of the read operation, wherein the next RAM bank is determined based on the two status words, wherein the read and write operations are performed in a single cycle, and for updating the status register to identify the RAM bank of the write operation.

7. The memory apparatus of claim 6, wherein the three RAM banks each have a capacity of m words.

8. The memory apparatus of claim 6, wherein the 2·m words of the status register are binary and each word has two bits.

9. The memory apparatus of claim 6, wherein the read and write addresses are random access addresses.

10. A method of operating a single-port memory in a single-cycle dual-port mode, wherein the memory has a logical capacity of N=k·m words and includes a number (k+1) of single-port random access memory (RAM) banks having an overall physical capacity of (k+1)·m memory words, and a status register for holding at least N=k·m status words, the method comprising:

setting data in the status register with an $i^{th}$ status word identifying which RAM bank has the last data written at an $i^{th}$ address, where $i \in [0, k \cdot m]$, and defining k status words for indicating k RAM banks that have valid data among the (k+1) RAM banks;

receiving by control logic of the memory, read and write enable signals, read and write addresses, and write data from a write data input;

supplying read data from a corresponding read address of a valid RAM bank to a read data output for a read operation, wherein the valid RAM bank for the read operation is determined based on the k status words;

writing write data from a write data input to a write address of a valid RAM bank for a write operation in the absence of contention with the RAM bank of the read operation;

writing write data from the write data input to the write address of a next RAM bank that has no valid data for the write operation at the write address in the case of contention with the RAM bank of the read operation, wherein the next RAM bank is determined based on the k status words;

wherein the read and write operations are performed in a single cycle; and updating the status register to identify the RAM bank of the write operation.

11. The method of claim 10, wherein the (k+1) RAM banks each has a capacity of m words.

12. The method of claim 10, wherein the k·m words of the status register are binary and each word has at least $\lceil \log_2(k+1) \rceil$ bits, where $\lceil \log_2(k+1) \rceil$ represents the next integer larger than $\log_2(k+1)$.

13. The method of claim 10, wherein the number (k+1) of RAM banks is at least three.

14. The method of claim 10, wherein the read and write addresses are random access addresses.

* * * * *